(12) United States Patent
Fabry et al.

(10) Patent No.: US 10,893,605 B2
(45) Date of Patent: Jan. 12, 2021

(54) TEXTURED TEST PADS FOR PRINTED CIRCUIT BOARD TESTING

(71) Applicant: Seagate Technology LLC, Cupertino, CA (US)

(72) Inventors: Michael Richard Fabry, Apple Valley, MN (US); William Bradford Green, Shakopee, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/424,270

(22) Filed: May 28, 2019

(65) Prior Publication Data

US 2020/0383203 A1  Dec. 3, 2020

(51) Int. Cl.
| | |
|---|---|
| H05K 1/02 | (2006.01) |
| H05K 1/11 | (2006.01) |
| H05K 1/18 | (2006.01) |
| H05K 7/02 | (2006.01) |
| H05K 7/06 | (2006.01) |
| G01R 1/067 | (2006.01) |
| G01R 1/073 | (2006.01) |

(Continued)

(52) U.S. Cl.
CPC ....... H05K 1/0268 (2013.01); G01R 31/2808 (2013.01); G01R 31/2818 (2013.01); H05K 1/111 (2013.01); H05K 3/244 (2013.01)

(58) Field of Classification Search
CPC ... H05K 1/02; H05K 1/11; H05K 1/18; H05K 7/02; H05K 7/06; G01R 1/067; G01R 1/073; G01R 31/00; G01R 31/02; G01R 31/26; G01R 31/28; H01L 21/00; H01L 21/02; H01L 21/44; H01L 21/60; H01L 21/66; H01L 21/70; H01L 21/82; H01L 23/00; H01L 23/48; H01L 23/58; H01L 23/544
USPC .......... 174/261, 250, 257; 324/73.1, 750.01, 324/750.03, 754.03, 754.07, 754.08, 324/754.14, 755.1, 755.08, 755.11, 324/763.01, 750.022, 762.01; 257/48, 257/737, 786, 778; 430/313, 318
See application file for complete search history.

(56) References Cited

U.S. PATENT DOCUMENTS 4,290,015 A * 9/1981 Labriola ............ G01R 31/2806
                                                 324/73.1
5,289,117 A   2/1994 Van Loan et al.
(Continued)

FOREIGN PATENT DOCUMENTS

DE  102004045719 B4  1/2007
DE  112006000497 B4  7/2015

Primary Examiner — Xiaoliang Chen
(74) Attorney, Agent, or Firm — Kagan Binder, PLLC

(57) ABSTRACT

A printed circuit board includes a substrate and at least one electrical circuit provided at least partially on a surface layer of the printed circuit board. The electrical circuit includes an electrical trace that is in electrical connection with a test pad provided for accessibility on the surface layer, the test pad being sized and shaped for probing to test an aspect of the circuit, the test pad having a conductive probe surface that is structured to provide at least one vertical surface that extends from the probe surface toward the surface layer and thus providing an edge between the vertical surface and the probe surface, the probe surface having a coating of a material to protect the conductive probe surface from corrosion.

7 Claims, 12 Drawing Sheets

(51) Int. Cl.
*G01R 31/00* (2006.01)
*G01R 31/02* (2006.01)
*G01R 31/26* (2020.01)
*G01R 31/28* (2006.01)
*H01L 21/00* (2006.01)
*H01L 21/02* (2006.01)
*H01L 21/44* (2006.01)
*H01L 21/60* (2006.01)
*H01L 21/66* (2006.01)
*H01L 21/70* (2006.01)
*H01L 21/82* (2006.01)
*H01L 23/00* (2006.01)
*H01L 23/48* (2006.01)
*H01L 23/58* (2006.01)
*H01L 23/544* (2006.01)
*H05K 3/24* (2006.01)

(56) References Cited

U.S. PATENT DOCUMENTS

| | | | | |
|---|---|---|---|---|
| 5,572,144 | A | 11/1996 | Davidson et al. | |
| 5,604,445 | A * | 2/1997 | Desai | G01R 1/0483 324/750.03 |
| 5,986,460 | A * | 11/1999 | Kawakami | G01R 1/07307 257/48 |
| 6,020,747 | A * | 2/2000 | Bahns | G01R 1/06738 324/754.14 |
| 6,156,484 | A * | 12/2000 | Bassous | G01R 1/06738 216/83 |
| 6,426,556 | B1 * | 7/2002 | Lin | H01L 24/03 257/738 |
| 6,683,387 | B1 * | 1/2004 | Brownfield | H01L 23/49811 257/778 |
| 6,940,093 | B2 | 9/2005 | Eldridge et al. | |
| 7,307,222 | B2 * | 12/2007 | Parker | G01R 31/2805 174/261 |
| 7,414,317 | B2 * | 8/2008 | Lee | H01L 21/4857 257/775 |
| 7,829,985 | B2 * | 11/2010 | Lee | H01L 21/4846 257/666 |
| 7,952,375 | B2 * | 5/2011 | Eldridge | G01R 1/06711 324/754.03 |
| 8,253,430 | B2 * | 8/2012 | Leon | G01R 1/06738 324/754.2 |
| 9,318,313 | B2 * | 4/2016 | Pagani | H01L 22/14 |
| 9,823,273 | B2 * | 11/2017 | Martin | G01R 3/00 |
| 2003/0162383 | A1 * | 8/2003 | Yamaya | H01L 22/32 438/622 |
| 2005/0093565 | A1 * | 5/2005 | Okamoto | H01L 22/14 438/14 |
| 2005/0227383 | A1 * | 10/2005 | Okamoto | G01R 1/07307 438/14 |
| 2006/0237855 | A1 * | 10/2006 | Kroehnert | H05K 1/111 257/779 |
| 2007/0018663 | A1 * | 1/2007 | Leinbach | G01R 3/00 324/754.03 |
| 2007/0090356 | A1 * | 4/2007 | Hanaoka | H01L 22/32 257/48 |
| 2007/0090854 | A1 * | 4/2007 | Hanaoka | G01R 31/2884 324/754.03 |
| 2007/0190671 | A1 * | 8/2007 | Okamoto | G01R 3/00 438/14 |
| 2008/0020498 | A1 * | 1/2008 | Okamoto | H01L 22/14 438/14 |
| 2008/0023832 | A1 * | 1/2008 | Chang | H01L 22/32 257/737 |
| 2008/0032456 | A1 * | 2/2008 | Ahn | H01L 25/105 438/124 |
| 2008/0190651 | A1 | 8/2008 | Klamminger et al. | |
| 2009/0289646 | A1 * | 11/2009 | Chen | G01R 1/06761 324/755.01 |
| 2010/0304510 | A1 * | 12/2010 | Okamoto | H01L 22/14 438/17 |
| 2011/0136272 | A1 * | 6/2011 | Okamoto | H01L 22/14 438/17 |
| 2011/0175634 | A1 * | 7/2011 | Okamoto | H01L 22/14 324/750.3 |
| 2012/0112781 | A1 * | 5/2012 | Kuitani | G01R 3/00 324/756.03 |
| 2013/0002284 | A1 * | 1/2013 | Deutinger | G01R 21/04 324/755.01 |
| 2013/0285056 | A1 * | 10/2013 | Pagani | H01L 25/0657 257/48 |
| 2015/0249060 | A1 * | 9/2015 | Gregorich | H01L 24/16 257/741 |
| 2015/0293149 | A1 * | 10/2015 | Koo | G01R 1/06744 324/755.01 |
| 2017/0176495 | A1 * | 6/2017 | Yin | C23C 8/20 |
| 2018/0063954 | A1 * | 3/2018 | Kim | G02F 1/13458 |

* cited by examiner

TEXTURED TEST PADS FOR PRINTED CIRCUIT BOARD TESTING

SUMMARY

This disclosure is directed to printed circuit board and testing technology where one or more circuits of a circuit board substrate are provided with test pads. The test pads can include conductive, copper test pad components that are in electrical connection with circuit traces. These test pads are sometimes referred to as satellite test pads in that they are spaced by a circuit trace to be accessible during test probing. By temporarily connecting the test pads with one or more external probes, the circuits can be tested for expected functionality (in-circuit test or ICT). Typically, a test probe is positioned to contact the test pad by pressure without being otherwise held to or attached to the test pad during testing. Good electrical contact is beneficial to avoid a test failure or a false reading. Multiple test probes and test pads can be used at the same time in a single testing pass.

Test pads are sometimes coated during manufacture to reduce corrosion of copper traces and pads during storage, shipment, or other delays. Some coatings are metallic and electrically conductive (e.g., a nickel-gold, silver, or other metallic coating) but others are not typically electrically conductive, and may be at least partially dielectric. In cases where dielectric coating is utilized, good probe contact is often negatively affected by the coatings on the test pads. In such cases, the probe can displace, pierces, or penetrate the coating with a probe tip. Example corrosion-resistant but non-conductive coatings include an organic solderability preservative (OSP) layer. OSP coating layers can have a lower cost, require fewer manufacturing/coating steps, and other beneficial aspects when compared to a nickel-gold or other metallic (e.g., conductive but corrosion resistant) coating. OSP coatings are generally easier to apply with an immersion process. OSP coatings, however, can sometimes interfere with or otherwise reduce electrical contact between probe and test pad.

Therefore, there is a desire for corrosion-resistant OSP coated pads to reduce costs compared to metallic coatings, but also there is also a need for consistent electrical contact and connection between a probe and a coated test pad. In order to enhance good electrical contact even with a test pad coated with OSP, embodiments of the invention provide a test pad with a textured probe contact surface. The textured surface preferably has edges and vertically extending surfaces that have been shown to enhance electrical contact in that first pass yields (FPY) can be dramatically increased. This means that fewer circuits and boards are subject to multiple test procedures and/or additional processing steps. Circuit testing yield is therefore increased in a given time period without requiring multiple test retries and/or additional testing fixtures to be run in parallel to accommodate retesting to achieve a sufficient percentage testing yield.

Preferred pad texturing comprises the creation of multiple structures or dimples extending within the test pad's thickness. The most preferred structure comprises an arrangement of the plural dimples arranged as a pattern with controlled dimple extension into the thickness of the test pad and a controlled spacing between adjacent dimples.

According to a first aspect of the present disclosure, a printed circuit board is disclosed. According to the first aspect, the printed circuit board includes a substrate and at least one electrical circuit provided at least partially on a surface layer of the printed circuit board. The electrical circuit includes an electrical trace that is in electrical connection with a test pad provided for accessibility on the surface layer, the test pad being sized and shaped for probing to test an aspect of the circuit, the test pad having a conductive probe surface that is structured to provide at least one vertical surface that extends from the probe surface toward the surface layer and thus providing an edge between the vertical surface and the probe surface, the probe surface having a coating of a material to protect the conductive probe surface from corrosion.

According to a second aspect of the present disclosure, a method of making a printed circuit board is disclosed. According to the second aspect, the method includes forming an electrical circuit with a least a portion of the circuit provided along a portion of a surface layer, the electrical circuit including at least an electrical trace that is also electrically connected with a test pad to allow the electrical circuit to be probe tested. The method also includes structuring a probe surface of the test pad to include at least one vertical surface that extends from the probe surface toward the substrate by partially removing test pad material from within a thickness of the test pad and thus creating an edge between the vertical surface and the probe surface. The method also includes coating the probe surface with a protective material to protect the probe surface from corrosion.

According to a third aspect of the present disclosure, a method of probing an electrical circuit as provided at least partially on a surface layer of a printed circuit board is disclosed. According to the third aspect, the method includes locating a test pad of the circuit as such test pad is provided for accessibility on the printed circuit board. The method also includes relatively moving a probe of an in circuit test unit toward a conductive probe surface of the test pad, the probe surface structured to provide at least one surface that extends from the probe surface toward the surface layer and that creates an edge between the vertical surface and the conductive probe surface. The method also includes displacing an amount of protective material covering the conductive probe surface by action of the probe contacting the protective material so as to permit conductive contact of the probe with the conductive probe surface.

BRIEF DESCRIPTION OF THE DRAWINGS

Other important objects and advantages of the present invention will be apparent from the following detailed description of the invention taken in connection with the accompanying drawings.

DETAILED DESCRIPTION

Figure 1:
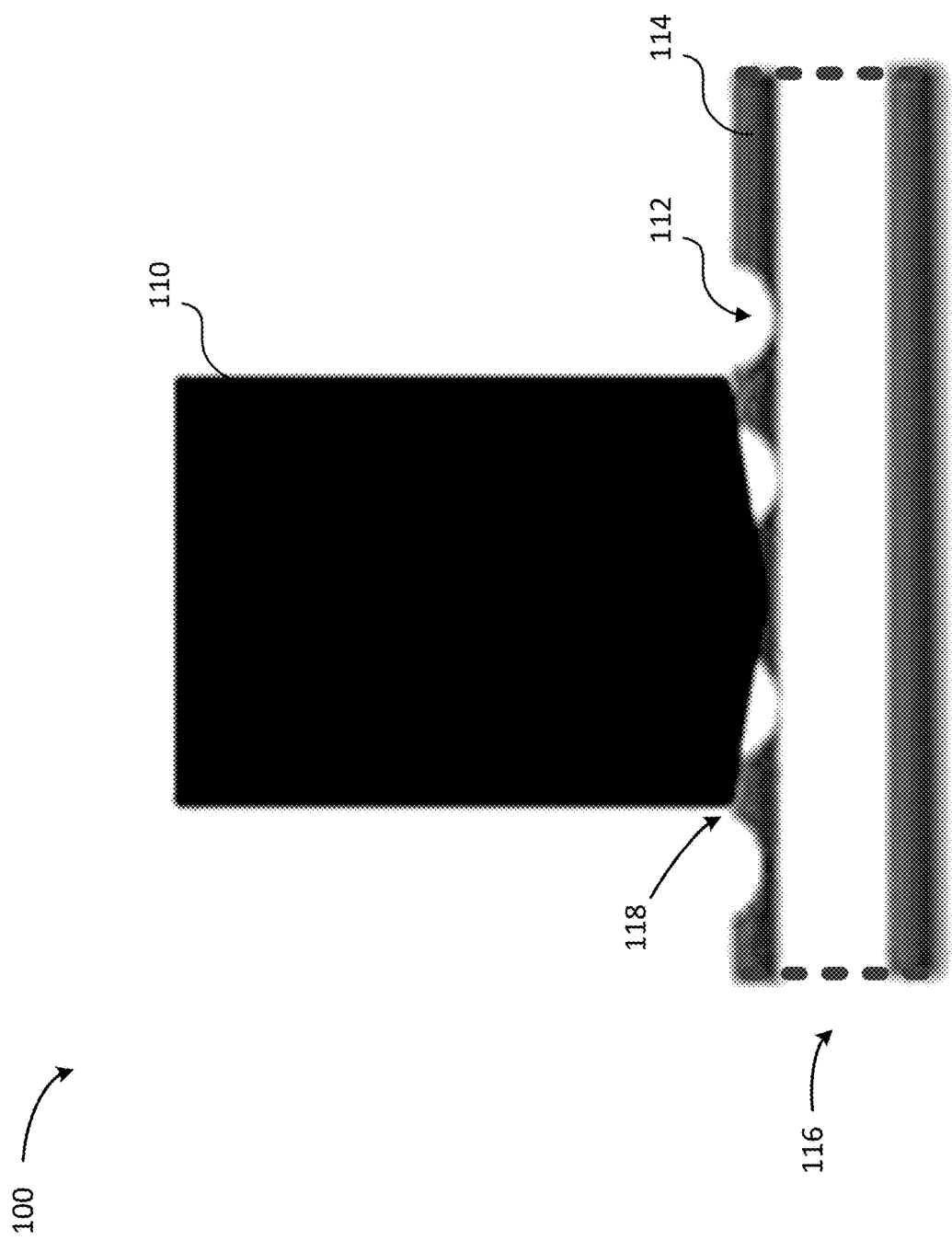
FIG. 1 is a diagram of a testing probe contacting a dimpled test pad during in-circuit testing, according to various embodiments.

The present disclosure relates to aspects of circuit testing, and relates in particular to improving first pass yields during circuit testing by facilitating test probe connection with coated test pads.

Many electronic devices include one or more printed circuit boards (PCBs). PCBs are complex electronic structures that have a substrate and a myriad of very small electronic components (e.g., transistors, resistors, capacitors, etc.), wires (e.g., vias, traces, etc.), circuits (e.g., integrated circuits), connection points or pads, among many others. Unfortunately, during PCB manufacture, one or more components of the PCB may be damaged, improperly formed, non-functional to certain standards, or otherwise deficient for various reasons. In order to produce and sell only functional PCBs, it has become common practice to submit newly-made PCBs to a battery of tests at various stages of PCB manufacture. Therefore, and for these testing purposes, some PCBs are manufactured with test pads to be used in testing one or more circuits or other components of the PCB.

Satellite test pads for PCB testing have existed in various forms for years, but the present disclosure makes a significant breakthrough over the prior art. In particular, a surface PCB test pad is caused to be textured or dimpled. This texture causes an increased conductive probe surface (or test pad surface) area by creating surface features that include vertical ridges and edges. These vertical ridges and edges in addition to various horizontal components, beneficially facilitate an in-circuit test probe to not only penetrate through an OSP coating or other test pad coating finish, but also to reduce negative conductivity effects caused by copper oxidation on the conductive probe surface. The probe in displacing the OSP coating can expose an underlying clean copper surface for the test probe to make contact with the test pad. Additionally, the texture or dimpling of the conductive probe surface can improve probe-test pad electrical contact due to topography of the test pad, even in cases where an OSP coating is not a factor. This can have the beneficial result of creating consistent electrical connections and reducing contact resistance between the test pad and probe, which can reduce false readings and improve PCB testing efficiency and accuracy.

In addition, a PCB's shelf life can sometimes be limited due to OSP coating hardening over time. After initial OSP coating, the OSP remains of a softness that allows probe displacement, which process is enhanced by the present invention. However, the OSP coating hardening can result in increased probe to copper test pad electrical resistance, creating an even larger demand for improved electrical contact between the probe and the test pad. In existing coated PCBs, after a certain time has passed, it may be necessary to refinish a test pad by stripping any OSP coating and removing corrosion from the test pads, before reapplying OSP coating, etc. Some corrosion can form on copper test pads even below an OSP coating. By texturing the conductive probe surface, the OSP coating hardening can have a reduced impact, and less negatively affect testing done even months after the OSP coating is applied to the test pad.

During PCB testing, a single testing pass can be used to test PCB components. However, at times a first pass fails to fully assess whether each PCB (and/or circuit thereof) is functional at the component level. Therefore, sometimes multiple testing passes are performed on at least some PCBs. Additional testing passes leads to time consumption, incurs costs, and generally delays delivery of functional PCBs that are falsely identified as being faulty. As used herein, first pass yield (FPY) refers to a first testing run on a particular PCB or group of PCBs. In particular, embodiments of the present disclosure are directed to improving FPY of PCBs during testing.

In a case of a test failure or negative test result, OSP coating surfaces on a PCB can be stripped, cleaned, cleared, etched, or refinished before performing additional testing, which adds cost and time. There has been some concern with respect to copper integrity on the PCB, the test pads in particular, due to OSP recoating and/or a stripping process. Therefore, embodiments of the present invention also have an advantage of reducing a likelihood of a need for refinishing and recoating of various OSP coating surfaces on test pads of a PCB to be tested. Previous attempts to improve FPY include a double stage test probe actuation and contact with the test pad. This double state test probe actuation can be conducted during each testing cycle prior to the probe electrically connecting to the test pad. This additional probe actuation lowers PCB assembly line units per hour and could also compromise a test pad through repeated non-testing contacts.

A form of PCB testing described is referred to as in-circuit testing (ICT). ICT involves testing and assessing components of a PCB, such as circuits of PCB 200 of FIG. 2. In ICT, defective individual or collective circuits or components are identified and can be identified for repair or replacement, accordingly. Another type of PCB testing is function testing (FCT), which involves checking the intended function(s) of the PCB 200, such as running various programs and assessing PCB performance compared to nominal. In some cases, and based on expected usage of the PCB 200, a typical usage environment can be simulated and the electrical and functional performance of the PCB 200 can be checked. Although embodiments of the present disclosure are directed toward aspects of ICT, it should be understood that the present disclosure also applies to aspects of FCT and other types of circuit and component testing.

Shown at diagram 100 of FIG. 1, an ICT testing probe 110 can be caused to contact a portion of an example test pad 116 at a probe-test pad contact point 118. The test pad 116 can have a conductive probe surface 114, and can be textured with one or more structures such as recessed dimples 112 in the probe surface 114. The dimples 112 can be formed in order to have a characteristic and defined maximum depth into the probe surface 114. In preferred embodiments, the dimples 112 reach a depth into the probe surface 114, but do not fully penetrate the probe surface 114. As shown, the dimples 112 can be rounded, but in other embodiments, the dimples 112 can be faceted, or can have any other suitable shape or contour. The dimples 112 can be formed by removing a portion of thickness of the probe surface 114. The removal of the thickness of the probe surface 114 to create the dimples 112 can be done by various chemical etching, laser-based, or other processes.

The one or more dimples 112 can together cause the probe surface 114 of the test pad 116 to have a multifaceted, curved, and/or textured surface. The contact point 118 between the probe 110 and the test pad 116 can occur as the probe 110 is caused to apply a pressure to the test pad 116 in order to create an electric connection. The electric connection can be a pressure-based connection.

Not shown in FIG. 1 is a corrosion-resistant coating on the test pad 116, which can include an OSP coating layer. OSP coating layer can be relatively deep/thick within dimples 112, and relatively thin above probe surface 114. However, at the edges of the structures or the dimples 112, the coating would be thinnest. As the probe 110 contacts the test pad 116, at least a portion of a coating (such as coating 1314 of FIG. 13) can be displaced, pierced, or penetrated by the probe 110. Piercing the coating may be easier for the probe 110 where the OSP coating layer is relatively thin, such as near the edges of dimples 112, or where the contact layer lacks dimples 112. These characteristics can have an effect on electrical contact and connection between the probe 110 and the probe surface 114.

As the probe 110 contacts the test pad 116, the probe 110 can in some cases be shaped, sized, and configured such that the probe 110 is both robust for repeated use and also able to create a reliable electric connection with the test pad 116, despite the presence of an OSP coating on the test pad 116. Therefore, in some embodiments, the probe 110 can have at least one angled tip portion part that is configured to assist the probe 110 in passing through the coating. In other embodiments, the probe 110 may not fully penetrate the coating when creating an electrical connection to the test pad 116. One existing method includes using a sharp and narrow testing probe to displace the coating by cutting or piercing through the OSP coating. OSP coating displacement can detrimentally compromise the test pad to a small degree. Therefore, the probe 110 can preferably maintain a relatively thick, robust shape, but can nevertheless create an electrical contact with the textured probe surface 114 of the test pad 116. Note that the probe 110 does not substantially deform the probe surface 114, and in diagram 100 the contact point 118 and other components as exaggerated for illustrative purposes.

Figure 2:
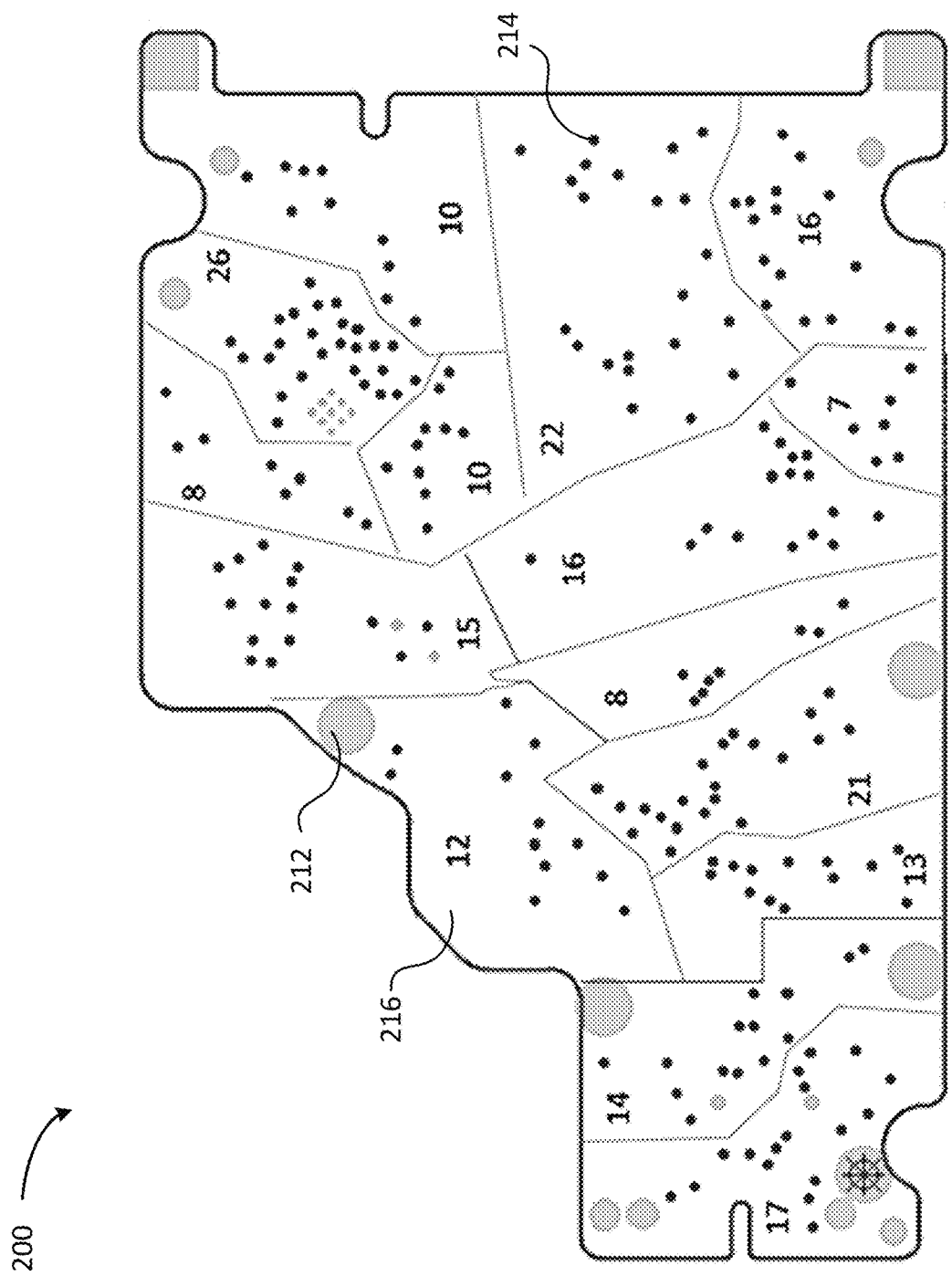
FIG. 2 is a top view of a circuit board to be tested in accordance with various embodiments.

Turning to FIG. 2, the PCB 200 can include one or more test pads 214, which can be similar to test pad 116 of FIG. 1. The PCB 200 can be formed from a board blank, after which various components are adding, creating PCB 200. Various solder masking and immersion process steps can be used in order to precisely install, create, coat, and/or etch various PCB 200 components during manufacture. PCT 200 can also include one or more PCB mounting points 212, which are mechanical in nature and perform no electrical function during ICT. Furthermore, PCB 200 can have at least one surface that is segmented into two or more regions 216, which are shown as numbered sections (e.g., region 12). As shown, a plurality of test pads 214 create an array of test pads 214 arranged as a pattern. The PCB 200 can have two sides (e.g., a top side and a bottom side), which can both be accessed during testing. In some cases, both sides of PCB 200 can be tested simultaneously. Optionally, a single side can also be used during testing where all the test pads 214 are on a single side of PCB 200.

During manufacture of PCB 200 including coated test pads 214, the test pads 214 can be formed as exposed, textured, copper test pads 214. The exposed test pads 214 can then be exposed to a chemical immersion process in which the entire PCB 200 is exposed, but an OSP coating forms only on the copper test pads due to a chemical reaction. Therefore, in preferred embodiments, only the test pads 214 will be coated in OSP material. In other embodiments, the test pads 214 can be coated individually or in groups on PCB 200.

Although not shown, various ICT testing units can be formed that have probes (e.g., probes 110) arranged in a pattern that mirrors the test pads 214 of one or more testing regions 216 on PCB 200. In this way, multiple or all test pads 214 can be electrically connecting to the testing unit in a simple movement, which can increase testing speed, particularly when the FPY of testing is relatively high, as in embodiments of the present disclosure. In some cases continuity, voltage, resistance, capacitance, or other electronic characteristics are measured during testing. In other embodiments, system(s)-on-a-chip can be tested on PCB 200.

In some preferred embodiments, PCB 200 test pads 214 can connect plural networks of connections or individual electrical circuits. A network or circuit can include, e.g., one or more copper traces that connect two or more test pads 214. Each network or circuit can be tested individually or in combination with other networks within PCB 200. PCB 200 can include hundreds, thousands, or more networks. One or more networks or circuits can be tested during ICT.

Figure 3:
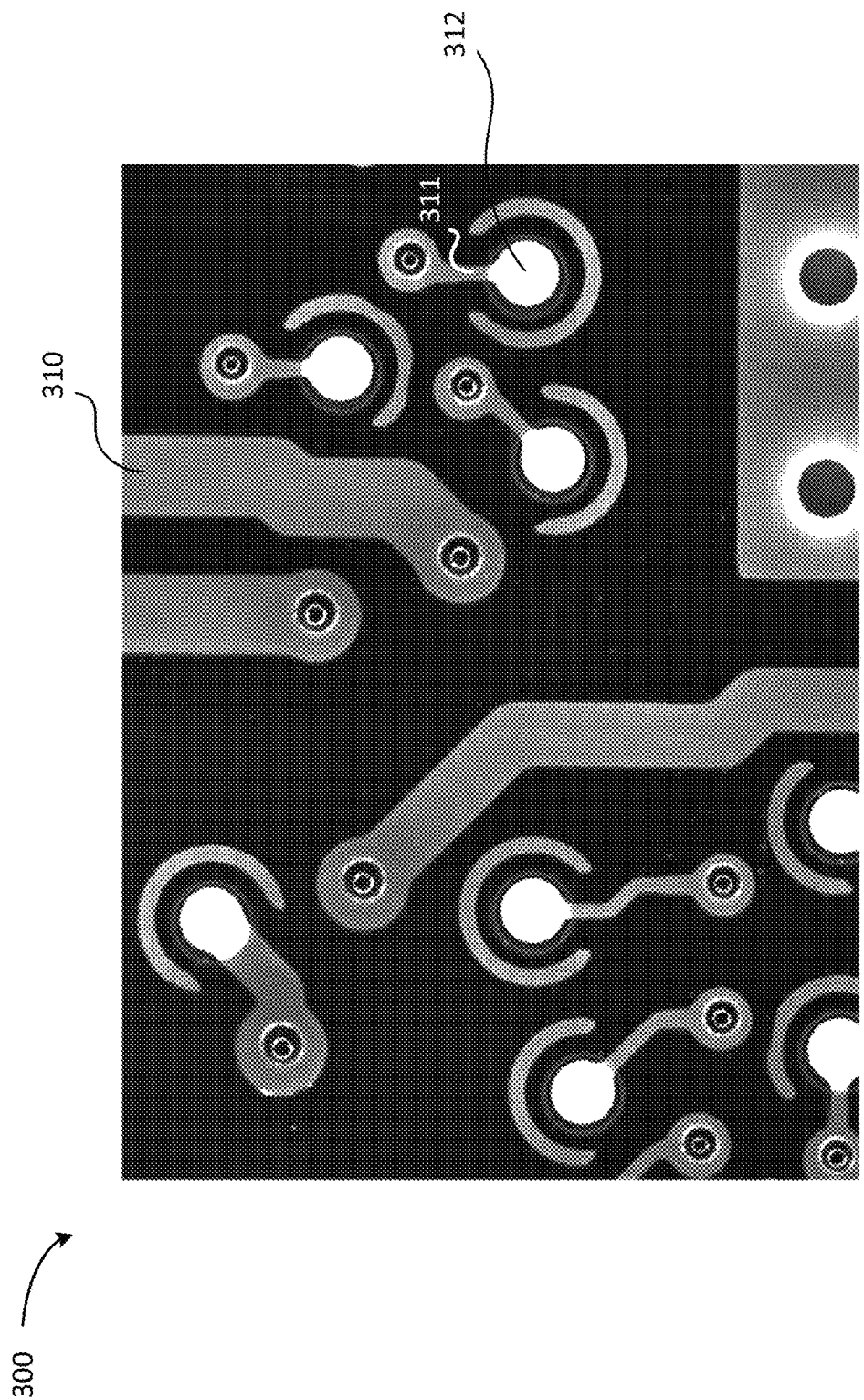
FIG. 3 is a view of a portion of a circuit board to be tested, according to various embodiments.
Figure 4:
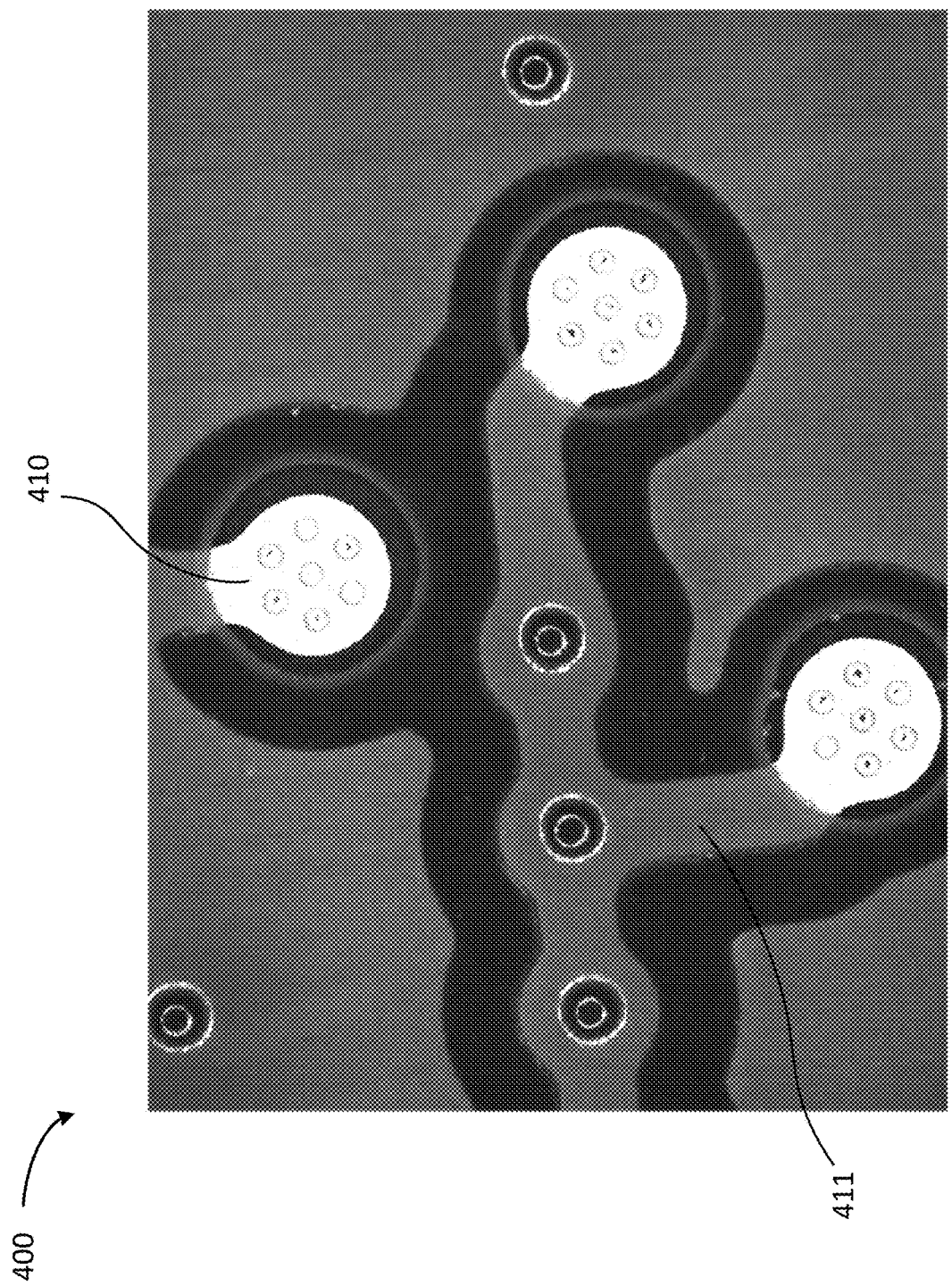
FIG. 4 is a close-up view of a portion of a circuit board to be tested, according to various embodiments.

FIG. 3 shows a portion 300 of a circuit board (e.g., PCB 200) to be tested, according to various embodiments. A test pad 312 and an electrical trace 311 are shown, among other test pads and PCB components. FIG. 4 is a close-up view of a portion of a circuit board (e.g., PCB 200) to be tested, according to various embodiments. Test pads 410 are shown in even greater detail, as connected to an electrical circuit of the PCB by a trace 411.

Embodiments of the present disclosure are particularly directed to improvements in the test pads 212 and their interaction with a test probe such as 110 of FIG. 1. In particular, by removing test pad material selectively at a test pad conductive surface, test pad dimpling or texturing can be created (e.g., as shown in 4, 5, 6, 9, and 11 in a preferred seven-dimple "honeycomb"-like pattern) on a probe surface of PCB 200's test pads 212 for using in at least ICT. During processing, test pad probe contact surface area can be increased, allowing for ICT probe penetration of the coating of a test pad 212 copper surface or other coating of the test pad. Test pad material can be selectively removed for forming structures such as dimples by any suitable material removal process, including but not limiting to: chemical etching (e.g., wet etching, dry etching, reactive ion etching, plasma etching, etc.), photolithography, machining (e.g., computer numerical control), shaving, polishing, removing with abrasives, laser, among many others.

Figure 7:
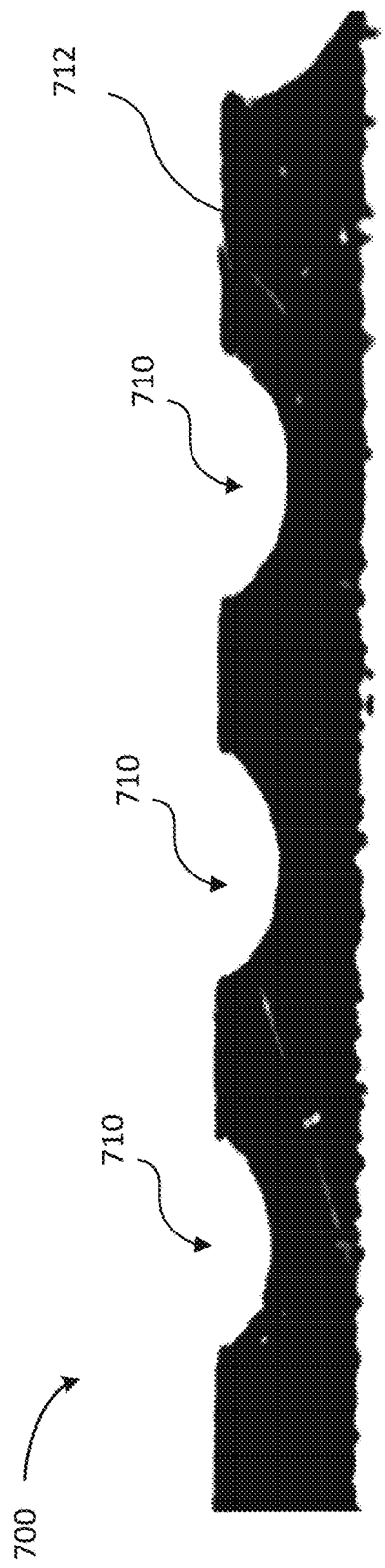
FIG. 7 is a cross-sectional view of a dimpled test pad where dimples have not merged, according to various embodiments.

Dimples, such as dimples 710/810 of FIGS. 7/8, respectively, represent one general type of texturing of a conductive probe surface 712/812, as used herein. Many other forms and embodiments of texturing, indentations, and varied dimpling are also contemplated in other embodiments. In more detail, texturing of conductive probe surfaces can be done in a prescribed, random, or semi-random fashion using various methods of reducing a thickness of various test pad portions on a conductive probe surface. A textured conductive probe surface can have a textured surface formed by multiple features or facets, including vertical or partially vertical portion or edges. By including at least partially vertical portions or edges, a conductive probe surface area for probe contact is increased as well. The term vertical means a direction having at least a component of extension from the conductive probe surface toward any underlying surface layer of the PCB.

In some embodiments, a conductive probe surface area that is structured can be beneficial during PCB or circuit testing. Therefore, one measurement of a conductive probe surface can include a total surface area of the test pad, and in some cases the total surface area of the test pad can be expressed as a ratio to a surface area of a similar test pad that lacks a texturing and/or vertical components (e.g., a smooth, flat test pad) to a textured conductive probe surface. In other embodiments, a number, size, and angle of various facets on the dimples can be optimized or maximized.

Figure 5:
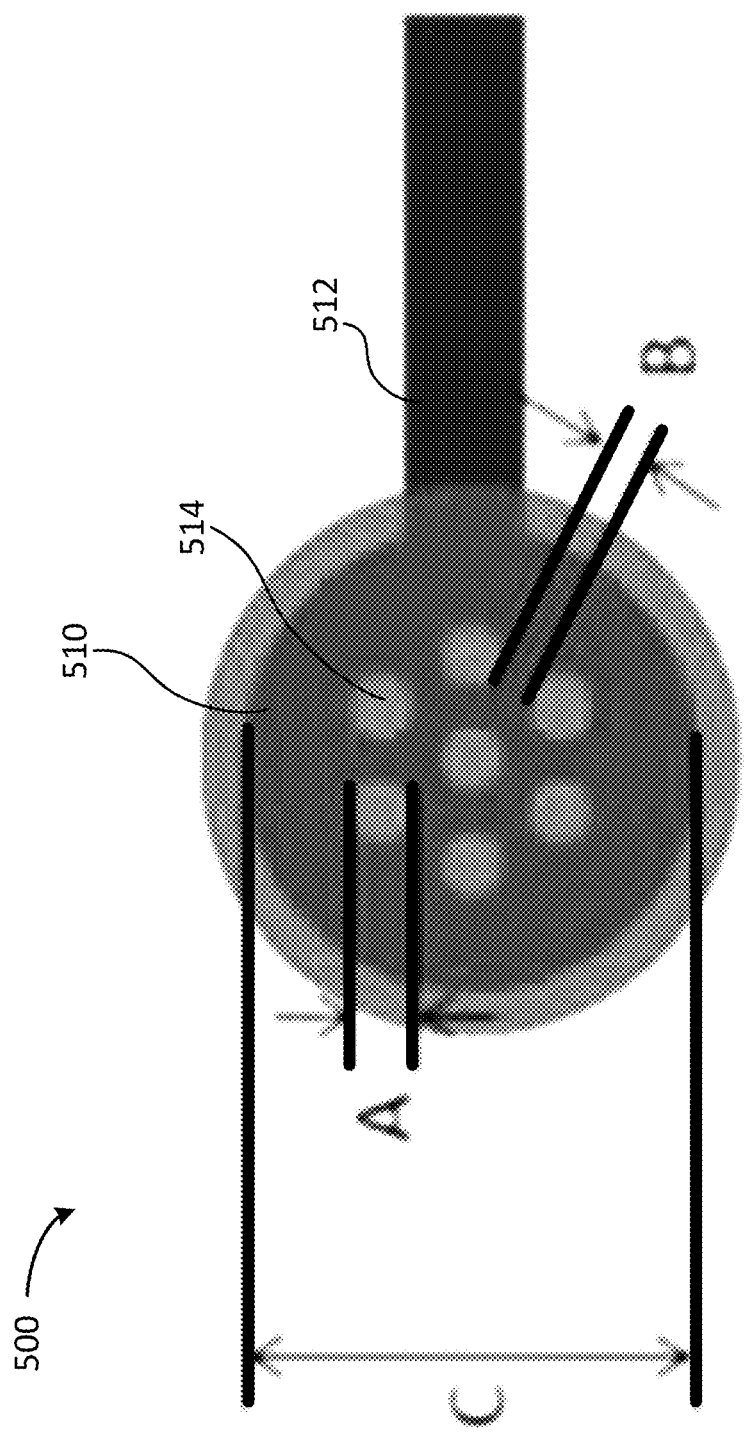
FIG. 5 is a diagram of a dimpled test pad, according to various embodiments.

According to FIG. 5, at diagram 500, a test pad 510 can be electrically connected to a trace 512. The test pad 510 can have any number of dimples, e.g., seven dimples 514 arranged in a regular and mutually equidistant pattern, as shown. The dimples 514 can be sized and spaced according to various parameters. As shown, test pad 510 includes various details, including a dimple cavity size at A (e.g., about 3 thousandths of an inch for a test pad having a 20 thousandths of an inch diameter, as illustrated); a dimple cavity clearance at B (e.g., about 2.5 thousandths of an inch or greater); and a dimple cavity test pad size at C (e.g., about 20 thousandths of an inch preferred). Therefore a dimple cavity pitch can be defined as the dimple cavity size A plus the dimple cavity clearance of B (e.g., about 5.5 thousandths of an inch total). A dimple cavity size at A can be measured in terms of width of the dimple cavity, but a depth of the dimple cavity may also be affected by the dimple cavity size. In some embodiments, a dimple cavity depth (not shown) may be at least partially commensurate with a dimple cavity size (width) at A.

For testing of test pad electrical contact and anti-corrosive performance, various dimple patterns and configurations can be devised to meet various target and testing requirements. Sizing and spacing of a predetermined dimple pattern can be specified in documentation, and can be based at least in part of a precision level of etching or other dimple-forming mechanisms. Some OSP coating displacement can in some cases lead to some test pad corrosion. A dimple pattern as shown was tested by Applicant for an 8-week test in a corrosive environment before and after test pad-probe contact/use, and it was found that performance of the test pads was not substantially impaired on the 8-week testing period due to corrosion on the test pads. Using a textured or dimpled test pad configuration reduces any impact of corrosion of the test pad during a testing procedure.

Figure 6:
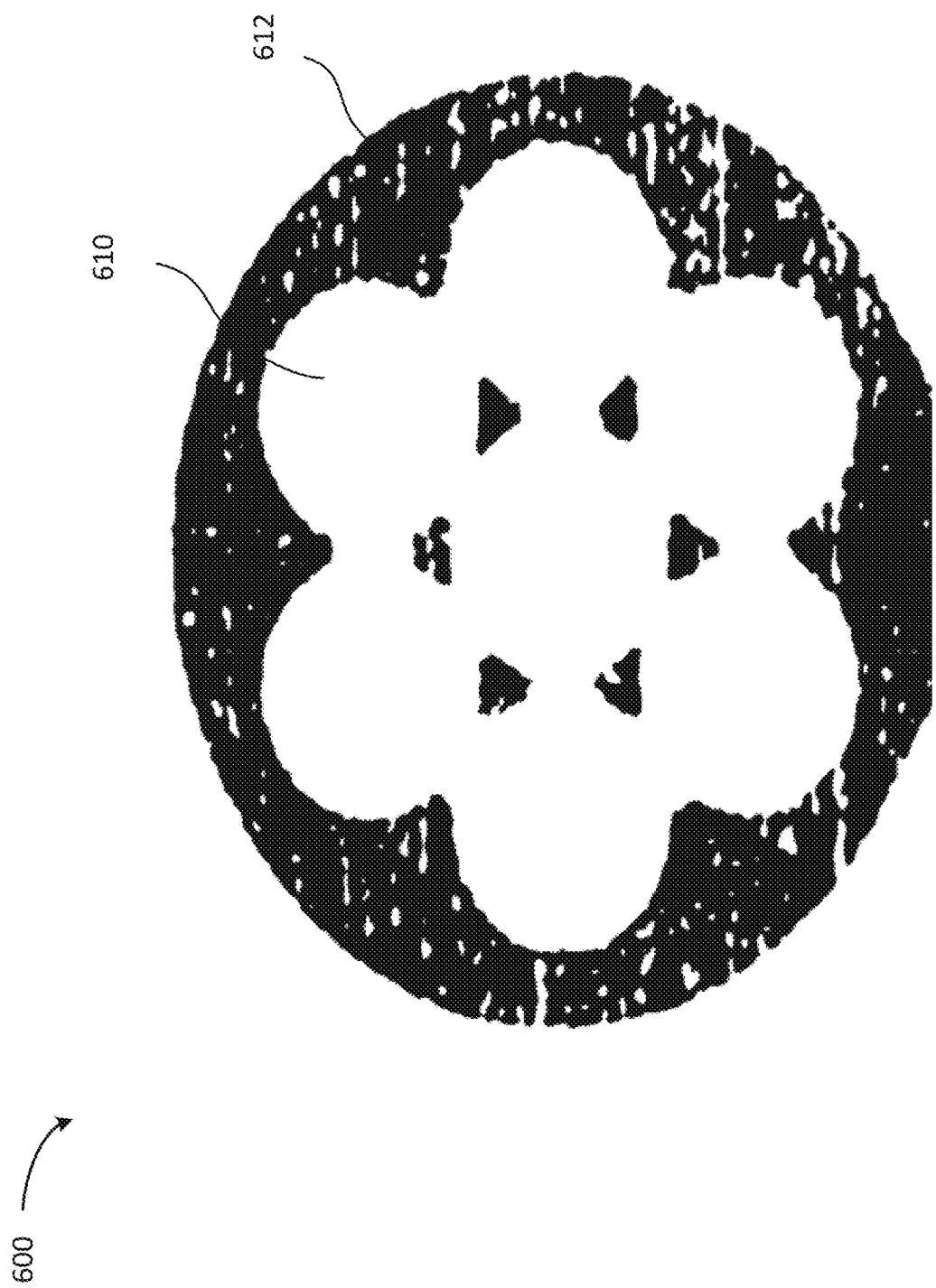
FIG. 6 is a top close-up view of a test pad where dimpled portions of the test pad have merged, according to various embodiments.
Figure 8:
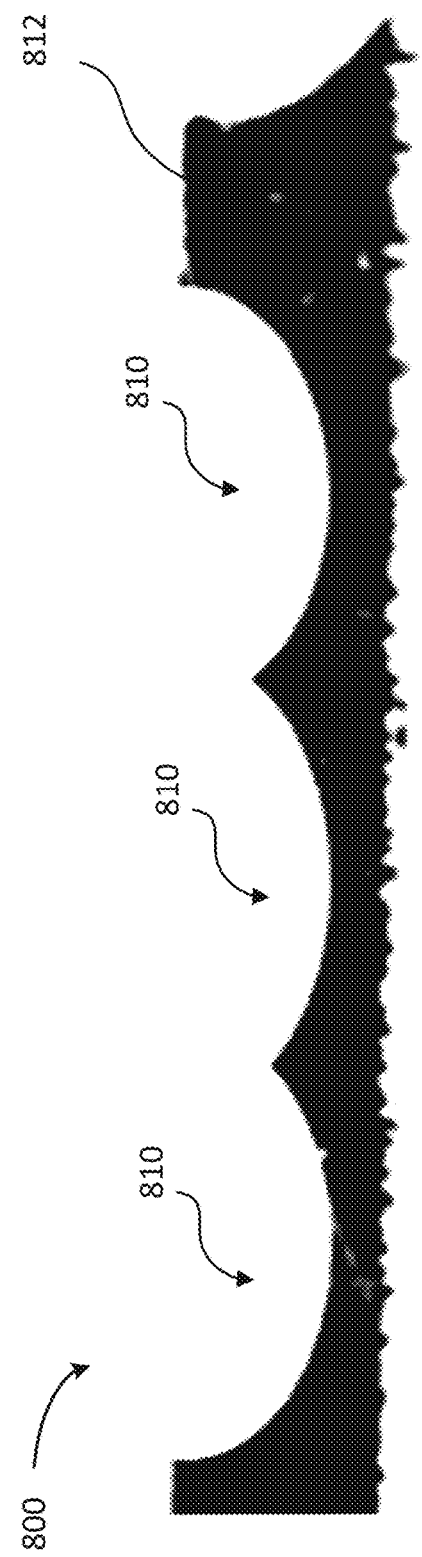
FIG. 8 is a cross-sectional view of a dimpled test pad where dimples have merged, according to various embodiments.

Turning now to FIG. 6, a close-up view of another example dimpling pattern is shown in greater detail at 600. In particular, dimples 610 on top copper surface 612 have merged as shown. Merged dimples as it is used herein refers to two or more dimples (e.g., 610) that are not entirely distinct and have at least some overlap in outlines, creating in effect fewer, but larger dimple-like recessed portions. This may lead to fewer edges, ridges, and vertical portions of the various dimples See cross-section at 800 of FIG. 8 with dimples 810 for another view of a merged-dimpled example conductive probe surface 812. In contrast, cross-section 700 of FIG. 7 showing conductive probe surface 712 shows dimples 710 separated by a distance, in a more preferable "unmerged" dimples embodiment.

During testing, merged dimples 610 may not cause ICT testing equipment to sense a PCB circuit rejection. However, merged dimples 610 may in some cases lead to the possibility of needed re-testing due to inadequate electric connections. In response to a finding of the merging of the dimples 610, the mechanisms used to create the dimples 610 may benefit from an adjustment of various (e.g., etching) parameters as a result of the merging in order to reduce merging for future PCBs and dimples. For example, in a closed-loop testing system, if dimples 610 are merging, various control parameters may be adjusted at earlier steps in order to minimize future dimple 610 merging. Separately, under-etched (etching too shallow) or missing (non-etched) dimples can be acceptable in some testing scenarios, and therefore also may not cause a rejection during PCB testing. Nevertheless, various dimple forming and/or etching control components may benefit from adjustments in these scenarios based on closed-loop feedback.

Figure 9:
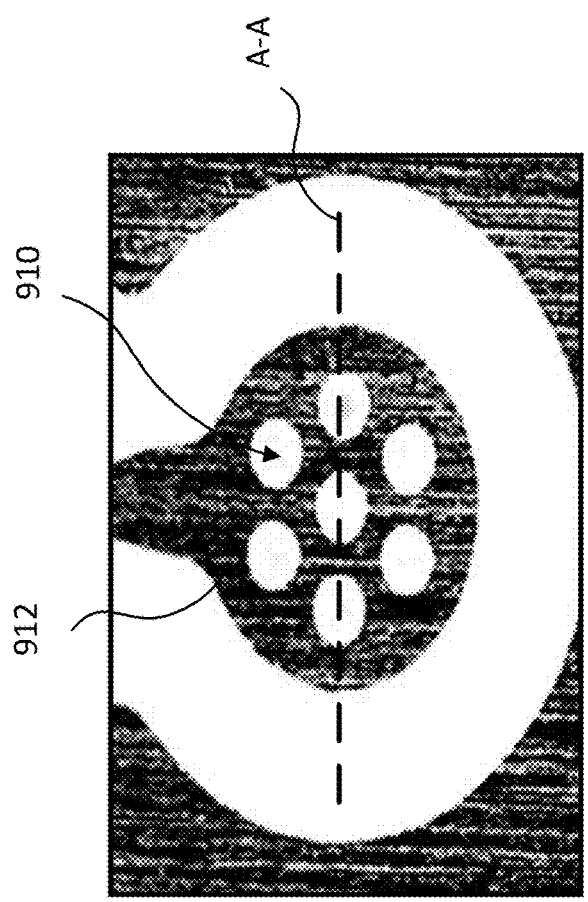
FIG. 9 is a top view of an example dimpled test pad, according to various embodiments.
Figure 10:
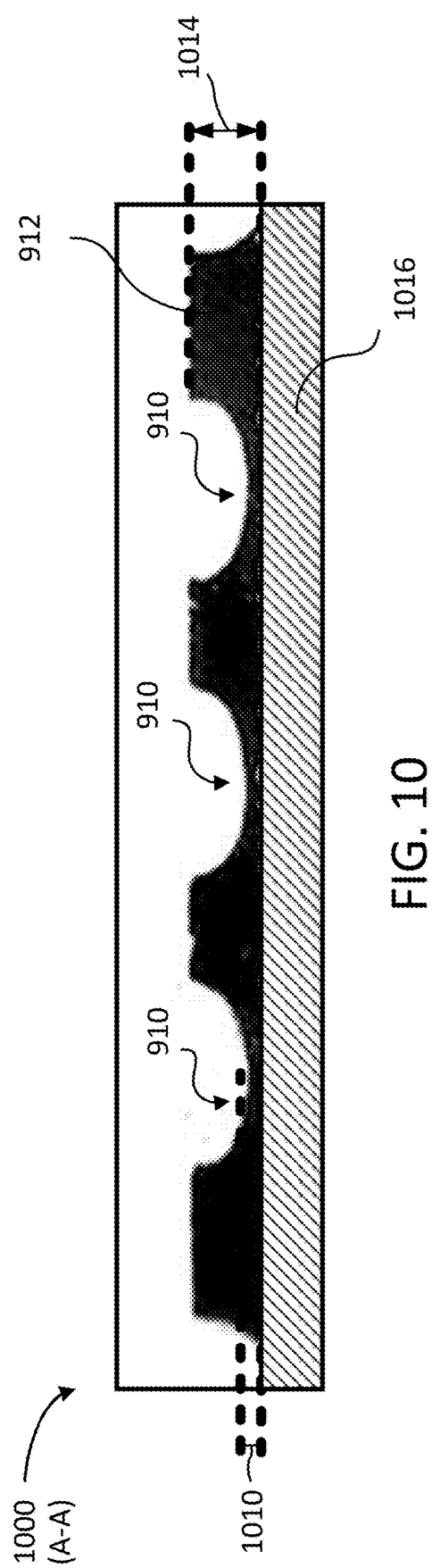
FIG. 10 is a cross-sectional view of the dimpled test pad of FIG. 9 taken along line A-A.

FIG. 9 is a top view of an example dimpled test pad 900 with a feature size selected to be about 3 thousands of an inch, for example, in an embodiment where a conductive probe surface 912 has a diameter of 20 thousandths of an inch. FIG. 10 is a cross-sectional view 1000 of the dimpled conductive probe surface 912 of FIG. 9 taken along line A-A. As shown, the dimpled conductive probe surface 912 has a feature (e.g., dimple 910) spacing of 2.5 thousandths of an inch, and a seven-dimple 910 pattern. Shown best in FIG. 10 is a conductive probe surface maximum depth (or maximum test pad thickness) at 1014, and a conductive probe surface preferred minimum depth at 1010. A dimple 910 depth (or thickness) can be equal to the maximum depth 1014 minus the minimum depth 1010. As shown in FIG. 10, the minimum depth 1010 is preferably non-zero. It is contemplated that the minimum depth 1010 can be zero but preferably not pass into a surface layer 1216, below, like a merged dimple 910. Thus, FIGS. 9 and 10 show an example of a preferred dimpled test pad arrangement, according to various embodiments.

Figure 11:
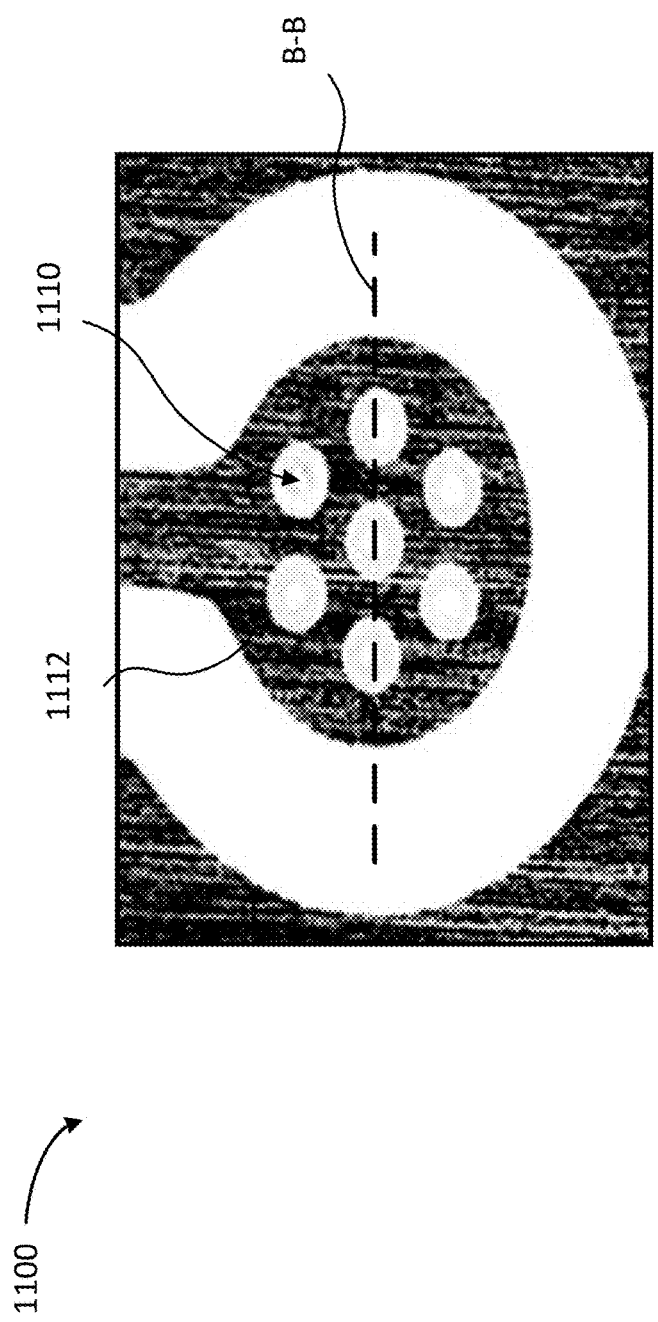
FIG. 11 is a top view of another example dimpled test pad, according to various embodiments.
Figure 12:
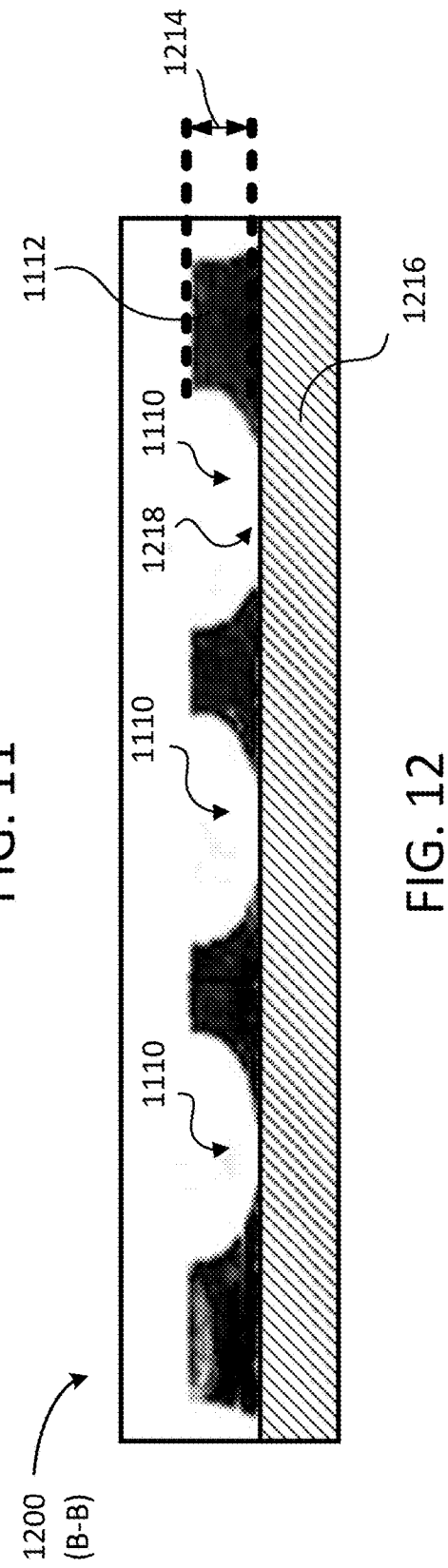
FIG. 12 is a cross-sectional view of the dimpled test pad of FIG. 11 taken along line B-B.

FIG. 11 is a top view of another example dimpled test pad 1100 with a feature seize selected to be about 3 thousandths of an inch, in an embodiment where a conductive probe surface 1112 has a diameter of 20 thousandths of an inch. FIG. 12 is a cross-sectional view 1200 of the dimpled test pad of FIG. 11 taken along line B-B, which reveals deeper dimples 1110, with little or no minimum depth for the shown test pad 1100 as compared to the dimples 910 of test pad 900 of FIGS. 9 and 10. The dimples 1110 at least partially reveal a surface of a surface layer 1216.

In contrast to FIGS. 9 and 10, in FIGS. 11 and 12 there is an equivalent maximum conductive probe surface depth 1214, but there is no equivalent minimum depth analogous to minimum depth 1016, as the dimples 1110 penetrate the thickness at dimple openings 1218 to reveal a surface layer 1216, below. Therefore, a dimple 1110 depth can be equivalent to a conductive probe thickness or its surface maximum depth 1214. Dimples 1110, as shown, are not merged dimples.

Also according to FIG. 12, an exposed surface of surface layer 1216 at opening 1218 can be caused to be revealed at a bottom of at least one dimple 1110. In a case where the surface layer opening at a bottom of a dimple 1110 is small enough, e.g., not greater than 1.6 thousands of an inch, the opening in the dimple 1110 may not cause a rejection during ICT. Nevertheless, the opening in the dimple 1110 may be cause for a closed-loop feedback arrangement with an etching mechanism, and the etching can be adjusted for various components, parameters, or settings as a result. In some embodiments, a signal can be created and sent that indicates that an adjustment should be made, and which parameters should be changed. For example, a signal can be sent that indicates to reduce an etch depth during the etching process.

Figure 13:
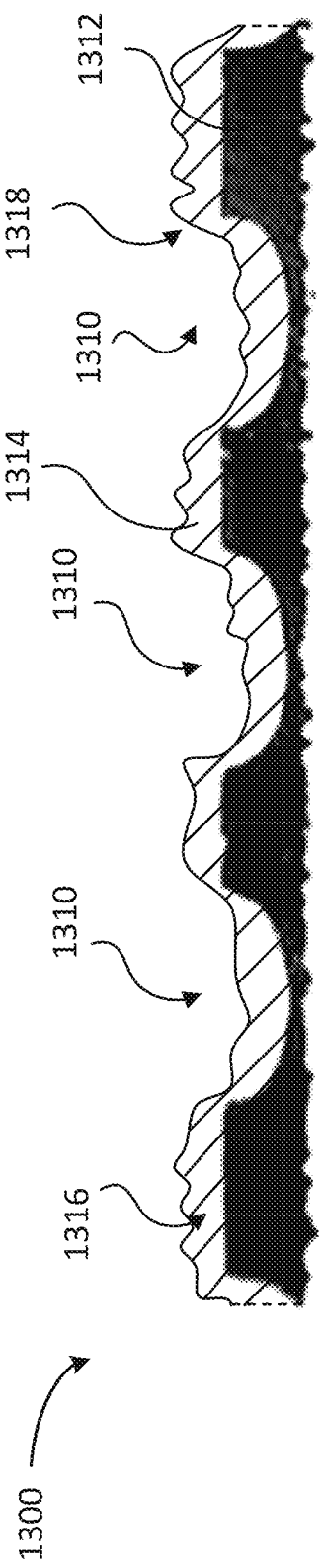
FIG. 13 is a cross-sectional view of a coated dimpled test pad, according to various embodiments.

FIG. 13 is a cross-sectional view 1300 of a coated dimpled test pad 1312, according to various embodiments. In particular, the dimpled test pad 1312 includes dimples 1310. A coating 1314 can be applied to the test pad 1312 by immersion, or any other coating process as described herein. The coating 1314 can be an OSP coating as described herein. As shown, the coating 1314 is distributed over a surface of test pad 1312, including some relatively thick coating regions 1316, and some relatively thin coating regions 1318. The relatively thick coating regions 1316 may be more likely to be found on portions of the test pad 1312 that are relatively flat and/or horizontal. On the other hand, the relatively thin coating regions 1318 may be more likely to be found on portions of the test pad 1312 that are relatively vertical and/or have edges.

Figure 14:
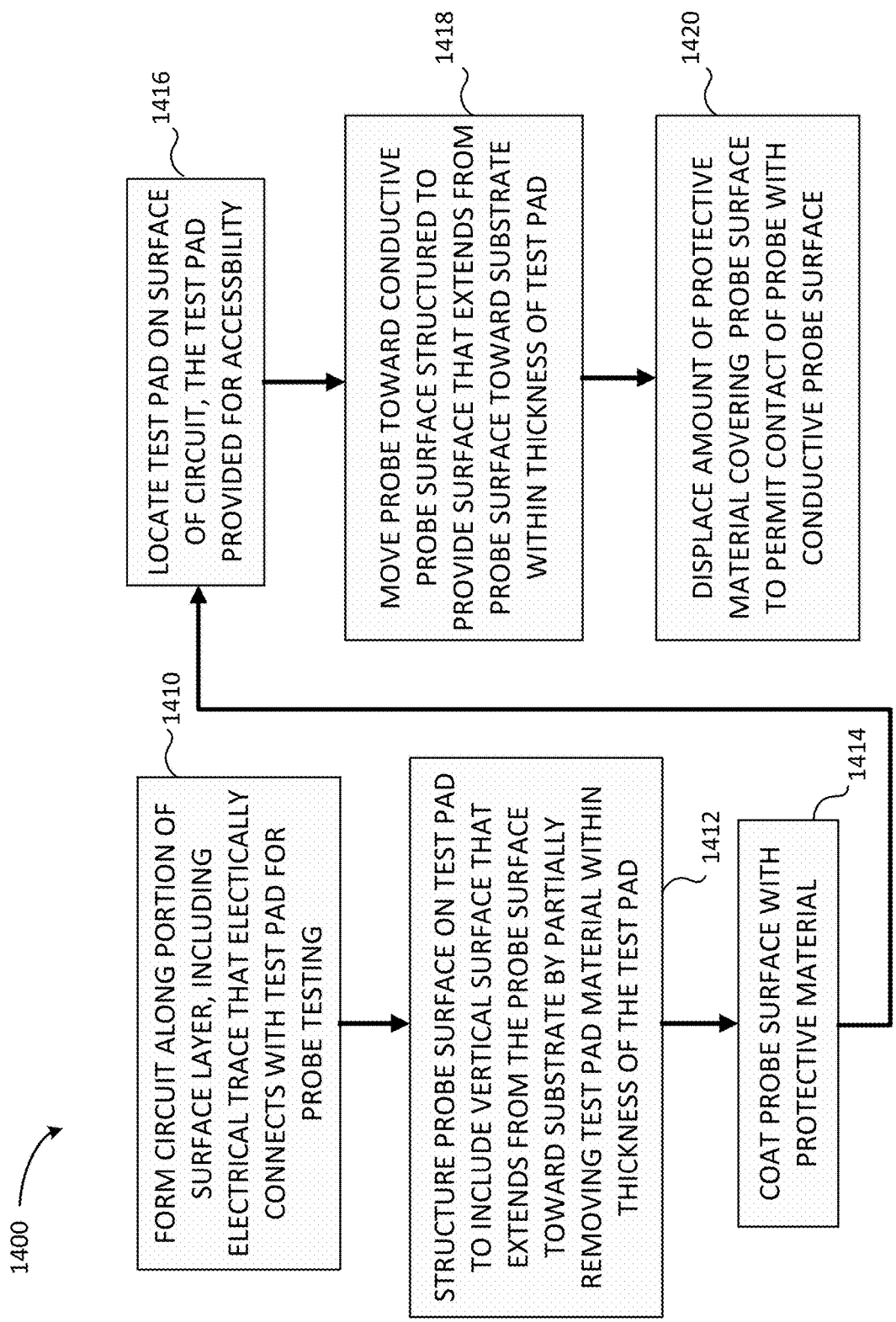
FIG. 14 is a flowchart of an example process in according with the present disclosure.

FIG. 14 is a flowchart of an example process 1400 in accordance with the present disclosure. According to FIG. 14, the process 1400 can begin by optionally forming a circuit at least along a portion of a surface layer of a substrate at operation 1410, the circuit including at least an electrical trace that is also electrically connected with a test pad to allow the circuit to be probe tested. Process can continue to operation 1412, where a probe surface of the test pad is structured on the test pad to include at least one vertical surface that extends from the probe surface toward the surface layer by partially removing test pad material within a thickness of the test pad. Next, at operation 1414, the probe surface can be coated with a protective material, such as shown in FIG. 13.

Process 1400 can continue by proceeding to operation 1416, where a test pad can be located on a surface of the circuit as such test pad is provided for accessibility on the printed circuit board. Next, an operation 1418, a probe of an in-circuit test (ICT) unit can be moved toward the conductive probe surface of the test pad, the probe surface structured to provide at least one surface that extends from the probe surface toward the surface layer, but within a thickness of the test pad. Process 1400 can continue to operation 1420, where an amount of protective material covering the probe surface is at least partially displaced so as to permit contact of the probe with the conductive probe surface.

Example Results from Testing by Applicant

Using test pads without a structured surface, a FPY during PCB testing can range from about 81-86% for ICT. This is generally considered to be below a desired level of PCB yield after a first pass. According to embodiments of the present disclosure, and according to Applicant's testing, when structured embodiments of the present disclosure are utilized, FPY for equivalent PCBs using equivalent procedures increases to roughly 95% or more, saving a significant amount of time and money during PCB testing.

According to one example, a main PCB for a hard-disk drive was tested using existing test pads, and were found to have a less than 85% ICT FPY. When textured test pads in accordance with the present disclosure were implemented on the same hard-disk drive type, one ICT test led to FPY of 2469/2500, or 98.76% FPY. FCT testing for the hard-disk drive PCB under the same parameters also improved to 99.20% FCT FPY. The same type of PCBs were subject to another ICT test, and the results were 2457/2500 (98.28%) FPY ICT.

According to another example, Applicant tested another type of PCB from a hard-disk drive using non-structured test pads and found a FPY of 46538/68208 PCBs (68.23% FPY). When embodiments of the present disclosure were implemented, the FPY increased to 27343/29122 (93.895% FPY). Similarly, Applicant tested yet another type of PCB. Using a non-structured test pad, FPY were 193870/249865 (77.59% FPY). When a structured test pad according to the present disclosure was used instead, the FPY of the PCB testing rose to 44632/49994 (89.27% FPY), a significant increase in each scenario. Applicant conducted testing of many different PCB types and configurations, and in each case, FPY was increased, and typically to a FPY of 93-97% or more.

Figure 15:
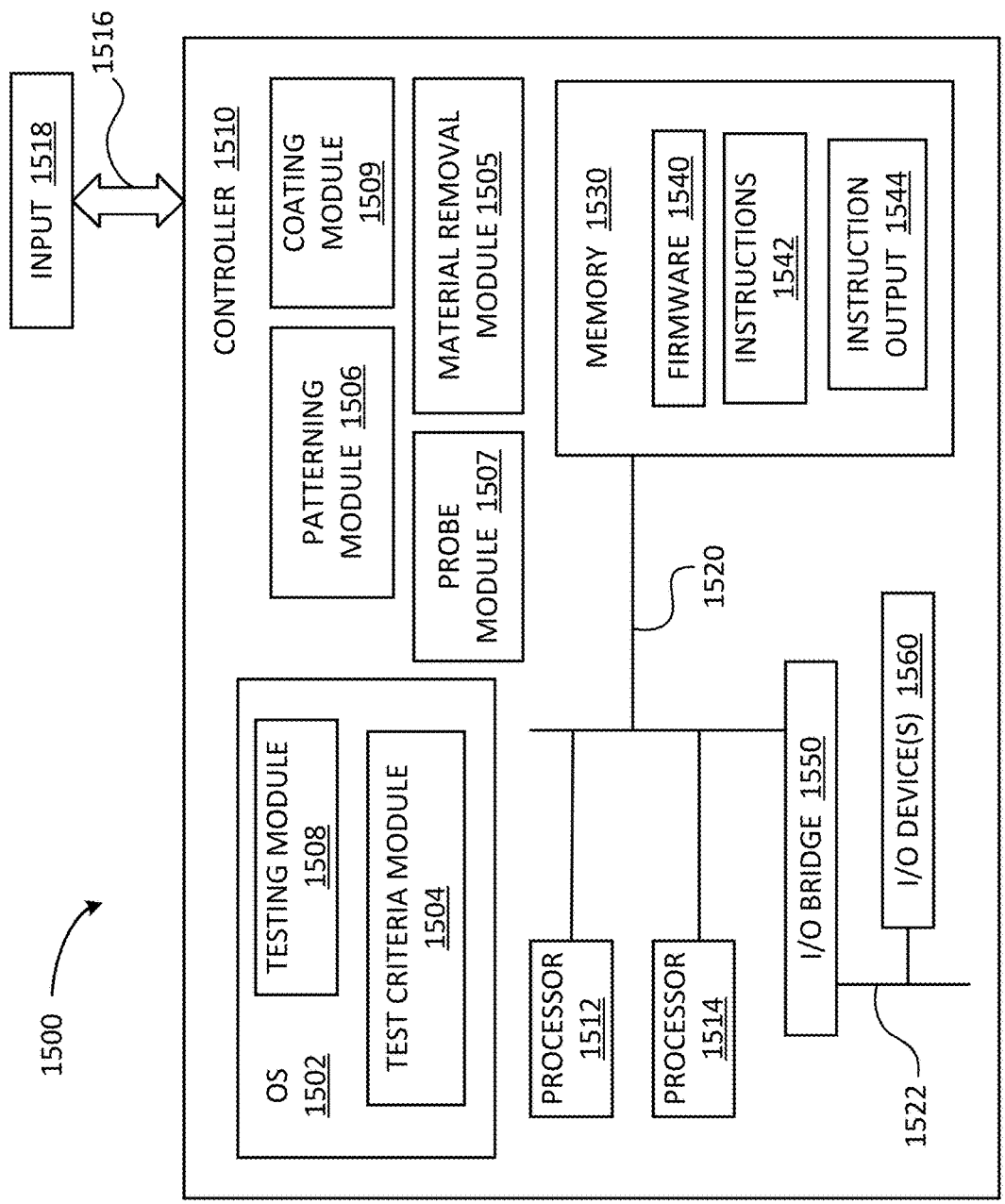
FIG. 15 is a block schematic diagram of a computer system according to embodiments of the present disclosure.

FIG. 15 is a block schematic diagram of a computer system 1500 according to embodiments of the present disclosure.

Computer system 1500, as shown, is configured with an interface 1516 to enable controller 1510 to receive a request to test one of more components of a PCB, as described in particular with regard to FIGS. 1-14. An input 1518 may be received at interface 1516. In embodiments, the interface 1516 can enable controller 1510 to receive, or otherwise access, the input 1518 via, for example, a network (e.g., an intranet, or a public network such as the Internet), or a storage medium, such as a disk drive internal or connected to controller 1510. The interface can be configured for human input or other input devices, such as described later in regard to components of controller 1510. It would be apparent to one of skill in the art that the interface can be any of a variety of interface types or mechanisms suitable for a computer, or a program operating in a computer, to receive or otherwise access or receive a source input or file.

Processors 1512, 1514 included in controller 1510 are connected by a memory interface 1520 to memory device or module 1530. In embodiments, the memory 1530 can be a cache memory, a main memory, a flash memory, or a combination of these or other varieties of electronic devices capable of storing information and, optionally, making the information, or locations storing the information within the memory 1530, accessible to a processor. Memory 1530 can be formed of a single electronic (or, in some embodiments, other technologies such as optical) module or can be formed of a plurality of memory devices. Memory 1530, or a memory device (e.g., an electronic packaging of a portion of a memory), can be, for example, one or more silicon dies or chips, or can be a multi-chip module package. Embodiments can organize a memory as a sequence of bit, octets (bytes), words (e.g., a plurality of contiguous or consecutive bytes), or pages (e.g., a plurality of contiguous or consecutive bytes or words).

In embodiments, computer 1500 can include a plurality of memory devices. A memory interface, such as 1520, between a one or more processors and one or more memory devices can be, for example, a memory bus common to one or more processors and one or more memory devices. In some embodiments, a memory interface, such as 1520, between a processor (e.g., 1512, 1514) and a memory 1530 can be point to point connection between the processor and the memory, and each processor in the computer 1500 can have a point-to-point connection to each of one or more of the memory devices. In other embodiments, a processor (for example, 1512) can be connected to a memory (e.g., memory 1530) by means of a connection (not shown) to another processor (e.g., 1514) connected to the memory (e.g., 1523 from processor 1514 to memory 1530).

Computer 1500 can include an input/output (I/O) bridge 1550, which can be connected to a memory interface 1520, or to processors 1512, 1514. An I/O bridge 1550 can interface the processors 1512, 1514 and/or memory devices 1530 of the computer 1500 (or, other I/O devices) to I/O devices 1560 connected to the bridge 1550. For example, controller 1510 includes I/O bridge 1550 interfacing memory interface 1522 to I/O devices, such as I/O device 1560. In some embodiments, an I/O bridge 1550 can connect directly to a processor or a memory, or can be a component included in a processor or a memory. An I/O bridge 1550 can be, for example, a peripheral component interconnect express (PCI-Express) or other I/O bus bridge, or can be an I/O adapter.

An I/O bridge 1550 can connect to I/O devices 1560 by means of an I/O interface, or I/O bus, such as I/O bus 1522 of controller 1510. For example, I/O bus 1522 can be a PCI-Express or other I/O bus. I/O devices 1560 can be any of a variety of peripheral I/O devices or I/O adapters connecting to peripheral I/O devices. For example, I/O device 1560 can be a graphics card, keyboard, mouse, stylus, gesture control sensor, or other input device, a hard-disk drive (HDD), solid-state drive (SSD) or other storage device, a network interface card (NIC), etc. I/O devices 1560 can include an I/O adapter, such as a PCI-Express adapter, that connects components (e.g., processors or memory devices) of the computer 1500 to various I/O devices 1560 (e.g., disk drives, Ethernet networks, video displays, keyboards, mice, styli, sensors, touchscreens, etc.).

Computer 1500 can include instructions executable by one or more of the processors 1512, 1514 (or, processing elements, such as threads of a processor). The instructions can be a component of one or more programs. The programs, or the instructions, can be stored in, and/or utilize, one or more memory devices of computer 1500. As illustrated in the example of FIG. 15, controller 1510 includes a plurality of programs or modules, such as patterning module 1506, probe module 1507, coating module 1509, and material removal module 1505. A program can be, for example, an application program, an operating system (OS) or a function of an OS, or a utility or built-in function of the computer 1500. A program can be a hypervisor, and the hypervisor can, for example, manage sharing resources of the computer 1500 (e.g., a processor or regions of a memory, or access to an I/O device) among a plurality of programs or OSes.

Programs can be "stand-alone" programs that execute on processors and use memory within the computer 1500 directly, without requiring another program to control their execution or their use of resources of the computer 1500. For example, controller 1510 includes (optionally) stand-alone programs in patterning module 1506, probe module 1507, coating module 1509, and material removal module 1505. A stand-alone program can perform particular functions within the computer 1500, such as controlling, or interfacing (e.g., access by other programs) an I/O interface or I/O device. A stand-alone program can, for example, manage the operation, or access to, a memory (e.g., memory 1530). A basic I/O subsystem (BIOS), or a computer boot program (e.g., a program that can load and initiate execution of other programs) can be a standalone program.

Controller 1510 within computer 1500 can include one or more OS 1502, and an OS 1502 can control the execution of other programs such as, for example, to start or stop a program, or to manage resources of the computer 1500 used by a program. For example, controller 1510 includes OS 1502, which can include, or manage execution of, one or more programs, such as OS 1502 including (or, managing) testing module 1508, and test criteria module 1504. In some embodiments, an OS 1502 can function as a hypervisor.

A program can be embodied as firmware (e.g., BIOS in a desktop computer, or a hypervisor) and the firmware can execute on one or more processors and, optionally, can use memory, included in the computer 1500. Firmware can be stored in a memory (e.g., a flash memory) of the computer 1500. For example, controller 1510 includes firmware 1540 stored in memory 1530. In other embodiments, firmware can be embodied as instructions (e.g., comprising a computer program product) on a storage medium (e.g., a CD-ROM, DVD-ROM, flash memory, or disk drive), and the computer 1500 can access the instructions from the storage medium.

In embodiments of the present disclosure, computer 1500 can include instructions for PCB testing and/or manufacturing. Controller 1510 includes, for example, patterning module 1506, probe module 1507, coating module 1509, and material removal module 1505, which can operate to design, manufacture, use, or test PCBs, in particular to improve a first run yield during testing.

The example computer system 1500 and controller 1510 are not intended to limiting to embodiments. In embodiments, computer system 1500 can include a plurality of processors, interfaces, and inputs and can include other elements or components, such as networks, network routers or gateways, storage systems, server computers, virtual computers or virtual computing and/or I/O devices, cloud-computing environments, and so forth. It would be evident to one of skill in the art to include a variety of computing devices interconnected in a variety of manners in a computer system embodying aspects and features of the disclosure.

In embodiments, controller 1510 can be, for example, a computing device having a processor (e.g., 1512) capable of executing computing instructions and, optionally, a memory 1530 in communication with the processor. For example, controller 1510 can be a desktop or laptop computer; a tablet computer, mobile computing device, personal digital assistant (PDA), or cellular phone; or, a server computer, a high-performance computer (HPC), or a super computer. Controller 1510 can be, for example, a computing device incorporated into a wearable apparatus (e.g., an article of clothing, a wristwatch, or eyeglasses), an appliance (e.g., a refrigerator, or a lighting control), a mechanical device, or (for example) a motorized vehicle. It would be apparent to one skilled in the art that a computer embodying aspects and features of the disclosure can be any of a variety of computing devices having processors and, optionally, memory devices, and/or programs.

It is understood that numerous variations of circuit test pads and probe systems and methods could be made while maintaining the overall inventive design of various components thereof and remaining within the scope of the disclosure. Numerous alternate design or element features have been mentioned above.

The foregoing specific embodiments of the present invention as set forth in the specification herein are for illustrative purposes only. Various deviations and modifications may be made within the spirit and scope of the invention without departing from the main theme thereof.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Although certain features are described generally herein relative to particular embodiments of the invention, it is understood that the features are interchangeable between embodiments to arrive at an improved circuit and PCB testing scheme and method that includes features of different illustrated embodiments.

What is claimed is:

1. A printed circuit board comprising a substrate and at least one electrical circuit provided at least partially on a surface layer of the printed circuit board, the electrical circuit comprising an electrical trace that is in electrical connection with a test pad provided for accessibility on the surface layer, the test pad being sized and shaped for probing to test an aspect of the circuit, the test pad having a conductive probe surface that is structured to provide at least one vertical surface that extends from the probe surface toward the surface layer and thus providing an edge between the vertical surface and the probe surface, the probe surface having a coating of a material to cover and protect the conductive probe surface from corrosion, the coating comprising a material that is at least partially dielectric.

2. The printed circuit board of claim 1, wherein the vertical surface extends within the thickness of the test pad.

3. The printed circuit board of claiml, comprising a plurality of structures each having a vertical surface extending within the thickness of the test pad creating a plurality of edges over the conductive probe surface of the test pad.

4. The printed circuit board of claim 3, wherein each structure comprises a dimple extending within the thickness of the test pad and the dimples are arranged in a predetermined pattern so that edges are positioned to be contacted during test probing of the test pads.

5. The printed circuit board of claim 4, wherein the predetermined pattern provides dimples in a regular pattern disposed over the conductive probe surface.

6. The printed circuit board of claim 5, wherein the test pad is circular and the predetermined pattern comprises a honeycomb pattern.

7. The printed circuit board of claim 1, further comprising plural electrical circuits of the printed circuit board, wherein test pads are arranged over the surface layer of the printed circuit board for test probing with each test pad being structured and coated with at least partially dielectric material to cover and protect the conductive probe surface from corrosion.

* * * * *